(12) United States Patent
Zihir et al.

(10) Patent No.: US 10,804,858 B2
(45) Date of Patent: Oct. 13, 2020

(54) POWER AMPLIFIER BIAS NETWORK IMPLEMENTATION FOR IMPROVING LINEARITY FOR WIDEBAND MODULATED SIGNALS

(71) Applicant: Integrated Device Technology, Inc., San Jose, CA (US)

(72) Inventors: Samet Zihir, San Diego, CA (US); Himanshu Khatri, San Diego, CA (US); Tumay Kanar, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 30 days.

(21) Appl. No.: 16/258,145

(22) Filed: Jan. 25, 2019

(65) Prior Publication Data

US 2020/0244228 A1    Jul. 30, 2020

(51) Int. Cl.
*H03F 3/04* (2006.01)
*H03F 1/08* (2006.01)
*H03F 3/24* (2006.01)
*H03F 1/02* (2006.01)

(52) U.S. Cl.
CPC ........... *H03F 1/083* (2013.01); *H03F 1/0216* (2013.01); *H03F 1/0261* (2013.01); *H03F 3/245* (2013.01)

(58) Field of Classification Search
CPC .... H03F 3/04; H03F 2200/18; H03F 2200/21; H03F 2200/222; H03F 2200/447
USPC ......................................... 330/285, 289, 296
See application file for complete search history.

(56) References Cited

U.S. PATENT DOCUMENTS

| | | | | |
|---|---|---|---|---|
| 5,361,042 A | * | 11/1994 | Gist | ...................... H03F 3/3001 327/307 |
| 7,119,620 B2 | * | 10/2006 | Pan | .......................... H03F 1/30 330/289 |
| 7,511,576 B2 | * | 3/2009 | Sugiyama | ............... H03F 1/302 330/285 |
| 2004/0124923 A1 | * | 7/2004 | Sato | ....................... H03G 3/007 330/285 |
| 2007/0096823 A1 | * | 5/2007 | Wang | ...................... H03F 3/191 330/285 |

* cited by examiner

*Primary Examiner* — Steven J Mottola
(74) *Attorney, Agent, or Firm* — Christopher P. Maiorana, PC

(57) ABSTRACT

An apparatus comprises an amplifier circuit and a bias circuit. The bias circuit is generally configured to dynamically adjust a bias voltage reference at a bias node connected to one or more input transistors of the amplifier circuit to maintain a low baseband impedance.

20 Claims, 10 Drawing Sheets

POWER AMPLIFIER BIAS NETWORK IMPLEMENTATION FOR IMPROVING LINEARITY FOR WIDEBAND MODULATED SIGNALS

FIELD OF THE INVENTION

The invention relates to amplifiers generally and, more particularly, to a method and/or apparatus for implementing a power amplifier (PA) bias network for improving linearity for wideband modulated signals.

BACKGROUND

Phased array antenna panels are used to generate steerable beams that may be utilized in wireless communication systems. Phased arrays create a focused beam that can be steered very quickly to maintain a link for any on-the-move communication system. Conventional wireless communications systems can also utilize steerable beams to communicate with multiple wireless nodes by moving the beams from one wireless node to the next. A single beam may service multiple wireless nodes in a sequence and repeat the sequence periodically such that each wireless node appears to be in constant communications with the system. The beam steering is generally implemented by power amplifiers (PAs) in the transceiver circuitry. The power amplifiers drive respective antenna elements of the phased antenna array to produce and steer the beams.

A reference bias current is used to bias the power amplifiers. The reference current is used to generate a reference voltage that is applied to bias transistors of a core of the power amplifier. There are different memory effects that may degrade amplifier performance under modulated waveforms. The memory effects include "baseband" memory effects, which have long time constants. Biasing circuits are in the category of baseband memory effects. Typically, the baseband impedance at the output of the biasing circuit is not constant over the modulation bandwidth. The baseband impedance variation over the modulation bandwidth at the biasing node of the power amplifier results in a baseband memory effect under wideband (e.g., >500 MHz) modulated waveforms. In systems implementing fifth generation (5G) wireless communication standards, the bandwidth of the modulated waveforms can be up to about 800 MHz.

It would be desirable to implement a power amplifier (PA) bias network for improving linearity for wideband modulated signals.

SUMMARY

The invention concerns an apparatus comprising an amplifier circuit and a bias circuit. The bias circuit is generally configured to dynamically adjust a bias voltage reference at a bias node connected to one or more input transistors of the amplifier circuit to maintain a low baseband impedance.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a power amplifier (PA) bias network (or circuit) implementation for improving linearity for wideband modulated signals that may (i) be applied to any amplifier, (ii) be implemented in multi-stage amplifiers, (iii) be implemented using a variety of semiconductor technologies, (iv) provide a bias network having a substantially constant output impedance up to a modulated signal bandwidth, (v) be utilized in beam former power amplifiers driving phased array antenna panels, (vi) generate a voltage reference using a unity-gain operational amplifier, (vii) utilize a band gap voltage, (viii) utilize a proportional to absolute temperature (PTAT) voltage, (ix) utilize a diode voltage, and/or (x) be implemented as one or more integrated circuits.

Figure 1:
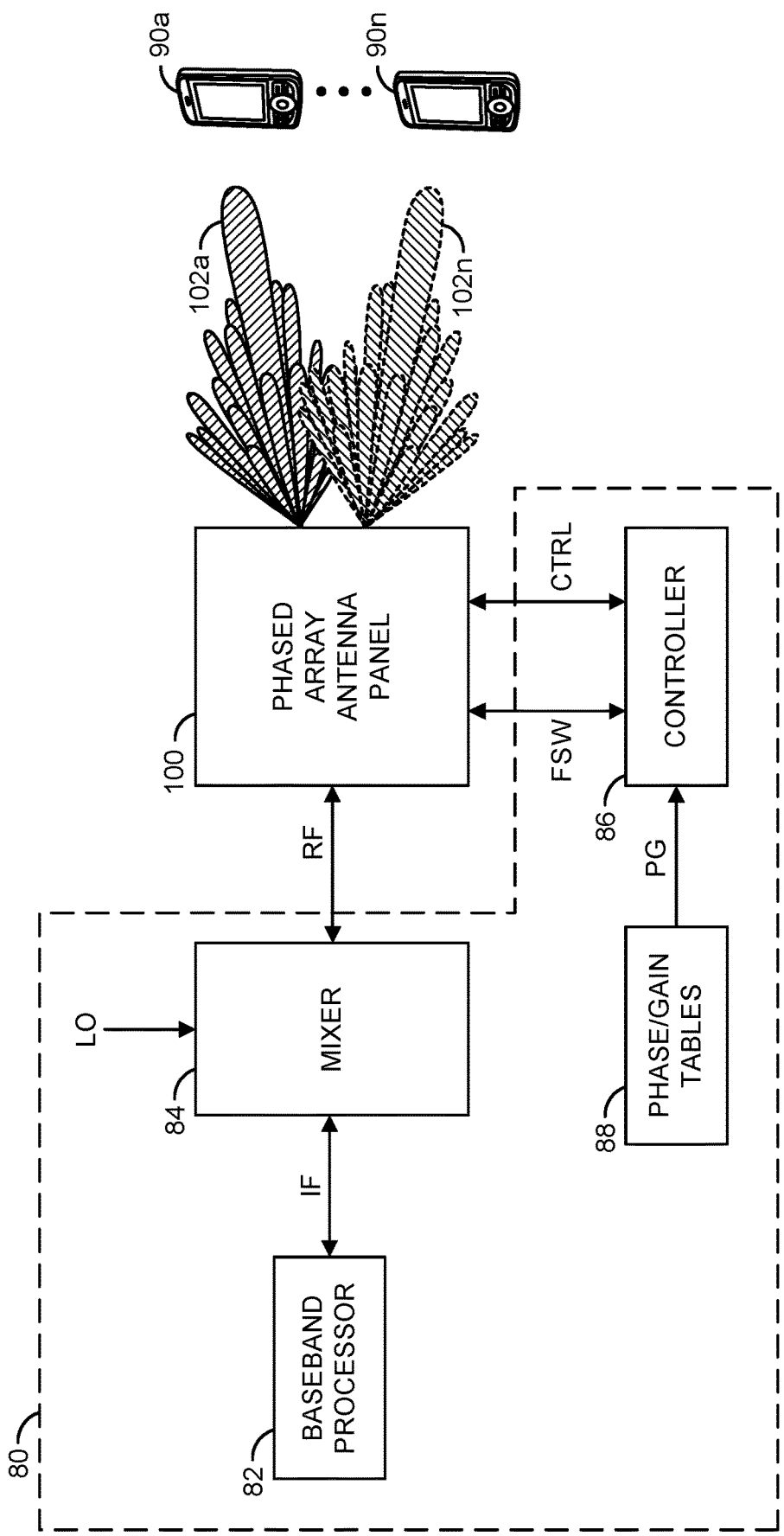
FIG. 1 is a diagram of a system illustrating an example context of the invention.

Referring to FIG. 1, a block diagram of a system 80 is shown illustrating an example context of the invention. The system (or module or circuit or apparatus) 80 may implement a radio-frequency (RF) transceiver system in accordance with an example embodiment of the invention. The RF transceiver system 80 may be configured to operate at common wireless radio frequencies, millimeter-wave frequencies, and/or microwave frequencies. In an example, the RF transceiver system 80 may be configured to facilitate communication with and/or between a plurality of communications devices (or terminals) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 100 in accordance with an example embodiment of the invention.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radio-communication Sector (ITU-R)), a satellite communication (SATCOM) system, and point-to-point communications systems such as common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. In various embodiments, the blocks 82-88 may be implemented with hardware, a combination of hardware and software, and/or simulated with software. A signal (e.g., IF) may be exchanged between the circuit 82 and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 100. The signal RF may be a radio-frequency, millimeter-wave frequency, or microwave frequency signal that conveys the information also found in the intermediate-frequency signal IF.

In a transmit mode, the radio-frequency signal RF may convey information to be broadcast from the phased array antenna panel 100 to the devices 90a-90n. In a receive mode, the radio-frequency signal RF may convey information received from the devices 90a-90n via the phased array antenna panel 100. A signal (e.g., FSW) and a signal or signals (e.g., CTRL) may be exchanged between the circuit 86 and the phased array antenna panel 100. The signal FSW may switch the phased array antenna panel 100 between the transmit mode and the receive mode. The signal(s) CTRL may convey data, clocking, and control elements. In an example, the signals FSW and CTRL may be part of a digital interface of the phased array antenna panel 100. In an example, the signal(s) CTRL may be implemented as a serial link that conveys information for configuring and/or determining phase and/or gain settings for antenna elements of the phased array antenna panel 100. In an example, the signal(s) CTRL may be compliant with one or more serial communication protocols or interfaces (e.g., serial peripheral interface (SPI), inter-integrated circuit communications (I²C), daisy chain, etc.). A signal or signals (e.g., PG) may be transferred from the circuit 88 to the circuit 86. In an example, the signal(s) PG may convey phase information and gain information used by the circuit 86 to implement (control) beam steering using the phased array antenna panel 100. In an example, the signal(s) PG may convey a plurality of phase and gain values that may be programmed into a plurality of beam former circuits of the phased array antenna panel 100 via the signal(s) CTRL.

The phased array antenna panel 100 generally implements a hard-wired address scheme. The hard-wired address scheme may be used to uniquely identify serial communications intended for elements (e.g., the beam former circuits) of the phased array antenna panel 100. In various embodiments, multiple phased array antenna panels 100 may be combined to form a larger antenna array that may provide more transmission channels. The multiple phased array antenna panels may share a serial communication channel, link, or bus. Each of the phased array antenna panels 100 making up the larger antenna array may be uniquely addressed using respective hard-wired addresses.

The phased array antenna panel 100 may generate one or more fields (or beams) 102a-102n. The fields 102a-102n may represent a field pattern (or radio-frequency beam pattern) created by the beam former circuits of the phased array antenna panel 100 based upon the phase and gain information (values) received via the signal(s) CTRL. The phased array antenna panel 100 may be configured to produce directional beams 102a-102n for communication with the communication devices 90a-90n. In an example, the phased array antenna panel 100 may be controlled to steer the beams 102a-102n, based on the phase and gain information received via the signal(s) CTRL, to track movement of the communication devices 90a-90n and/or switch between the communication devices 90a-90n.

The circuit 82 may implement a baseband processor circuit. The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90a-90n.

The circuit 84 may implement one or more mixer circuits. The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4 GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

The circuit 86 may implement a control circuit. In various embodiments, the circuit 86 may be implemented using one or more of an application specific integrated circuit (ASIC), controller, microprocessor, or circuitry configured accordingly. The circuit 86 is generally operational to control the operations of the phased array antenna panel 100. In some embodiments, the circuit 86 may determine the setting values used in each transceiver channel within the beam former circuits of the phased array antenna panel 100. The setting values may establish the geometry of the field(s) or beam(s) 102a-102n. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the phased array antenna panel 100 to establish the fields 102a-102b. The phase values and the gain values may be fetched from the circuit 88 via the signal PG and programmed into buffers associated with the beam former circuits of the phased array antenna panel 100 by the circuit 86. In various embodiments, the circuits 86 and 88 may be implemented either on the same integrated circuit or on different (separate) integrated circuits.

In an example, the phased array antenna panel 100 may be implemented comprising either single-polarization (or single-pole) antenna elements or dual-polarization (or dual-pole or di-pole) antenna elements. The phased array antenna panel 100 may be operational to transmit and receive wireless signals to and from the devices (or terminals) 90a-90n. The devices (or terminals) 90a-90n may be remotely located from the RF transceiver system 80. Sensitivity to the wireless signals may be determined by the fields 102a-102n created by the phased array antenna panel 100. The phased array antenna panel 100 may comprise a plurality of antenna elements and a plurality of beam former circuits. Each beam former circuit may implement a plurality of transceiver channels. Each transceiver channel generally comprises a transmit channel and a receive channel. The transceiver channels may be coupled to the antenna elements by corresponding bidirectional radio-frequency signals. The transceiver channels and antenna elements generally form a two-dimensional antenna network.

Figure 2:
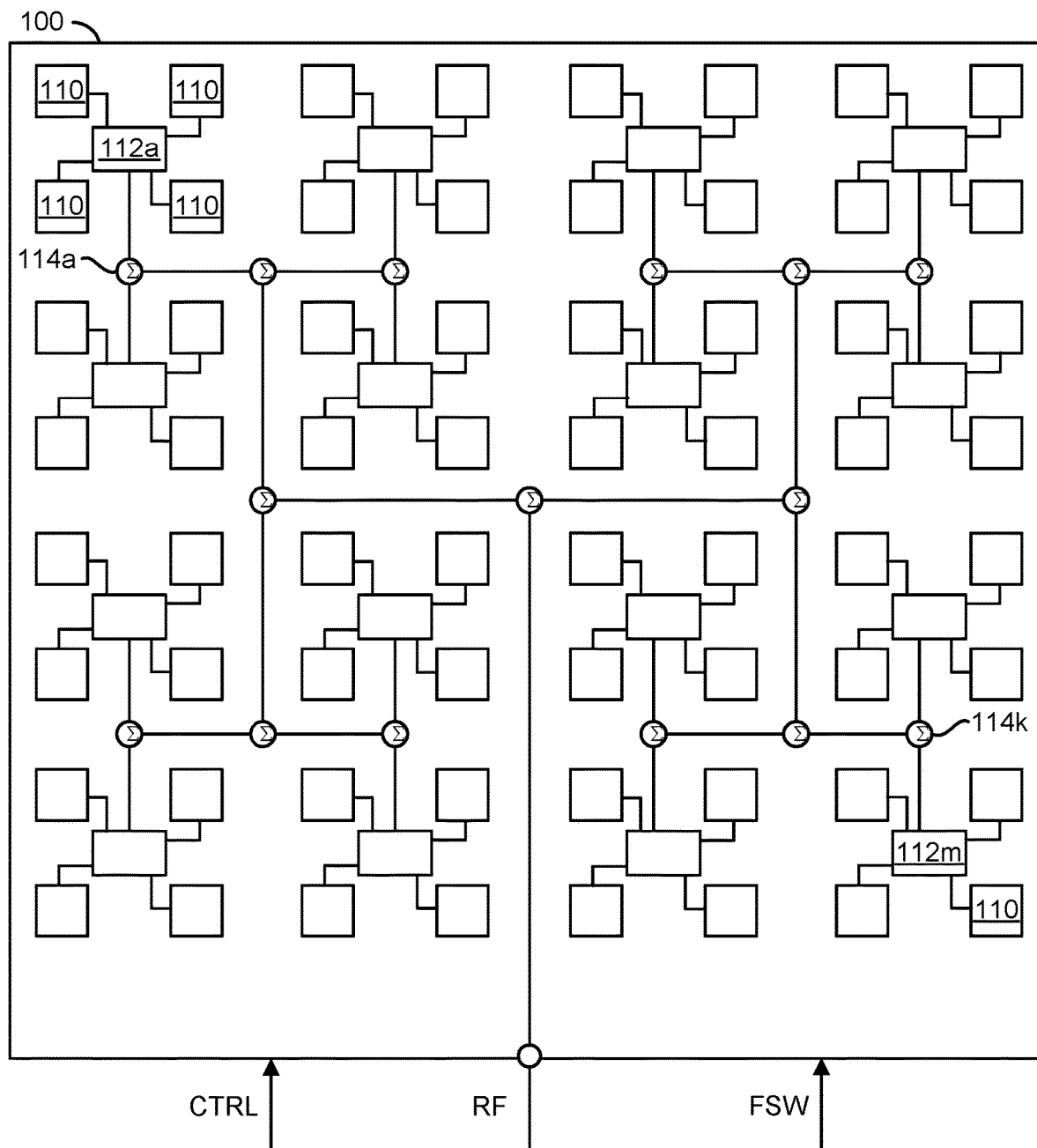
FIG. 2 is a diagram illustrating an example implementation of a single-polarization phased array antenna panel in accordance with an example embodiment of the invention.

Referring to FIG. 2, a diagram is shown illustrating an example implementation of a single-polarization version of the phased array antenna panel 100 in accordance with an embodiment of the invention. In an example, the phased array antenna panel 100 may comprise a number of blocks (or circuits) 110, a number of blocks (or circuits) 112a-112m, and a number of blocks (or circuits) 114a-114k. In embodiments implementing a single-polarization phased array antenna panel, the blocks 110 generally are implemented as single polarization (or single-pole) antenna elements. Each of the circuits 112a-112m may implement a single-polarization beam former circuit. Each of the circuits 114a-114k may implement a combiner/splitter circuit. The circuits 112a-112m, and 114a-114k may be implemented with hardware, a combination of hardware and software, and/or simulated with software. In an example, the signal RF may be exchanged with one of the circuits 114a-114k and distributed by or combined by a remainder of the circuits 114a-114k. The signals FSW and CTRL may be exchanged with the circuits 112a-112m.

The antenna elements 110 in the phased array antenna panel 100 may be used for both transmission and reception. A physical positioning of the antenna elements 110 generally provides for two-dimensional (e.g., horizontal and vertical) control of the fields 102a-102n. In an example, the antenna elements 110 may be arranged in a 2-dimensional (e.g., N×N) grid pattern, where N is an integer value divisible by 2. However, other dimensions of grid patterns may be implemented accordingly to meet design criteria of a particular implementation.

The circuits 112a-112m are generally operational to multiplex/demultiplex the signal RF with a number of the antenna elements 110. In various embodiments, each of the circuits 112a-112m may be mounted on a substrate of the phased array antenna panel 100 adjacent to (e.g., centered among) a number (or group) of the antenna elements 110. In an example, each circuit 112a-112m generally comprises a number of transceiver channels that are coupled to respective antenna elements 110. In an example, each circuit 112a-112m may be coupled to four adjacent antenna elements 110 (e.g., arranged in a 2×2 grid around each circuit 112a-112m). However, other numbers (e.g., 1, 2, 4, 18, etc.) of adjacent antenna elements 110 may be implemented to meet design criteria of a particular implementation. The circuits 112a-112m may be configured to switch between a transmit mode and a receive mode in response to the signal FSW. In the transmit mode, the circuits 112a-112m may be operational to rapidly change setting values (e.g., phase values, gain values, etc.) used by the transceiver channels in order to steer the beams (or fields) 102a-102n formed by the phased array antenna panel 100. In various embodiments, each of the circuits 112a-112m may be implemented as one or more integrated circuits (e.g., in a package or multi-chip module (MCM)).

In various embodiments, each of the circuits 114a-114k may be implemented as a combiner/splitter circuit. In an example, the circuits 114a-114k may be implemented as Wilkinson combiner/splitters. In various embodiments, the circuits 114a-114k may be coupled together to form a network that couples the circuits 112a-112m to an input/output of the phased array antenna panel 100 configured to present/receive the signal RF. In the transmit mode, the circuits 114a-114k are generally operational to distribute the power in the signal RF among the circuits 112a-112m. In the receive mode, the circuits 114a-114k may be operational to combine the power received in signals from the circuits 112a-112m into the signal RF. The circuits 112a-112m and 114a-114k are generally configured to provide a substantially equivalent path length between the RF input/output of the phased array antenna panel 100 and each of the circuits 112a-112m.

In embodiments implementing a dual-polarization version of the phased array antenna panel 100, the antenna elements 110 may be implemented having horizontal and vertical feed ports. The circuits 112a-112m may be configured to be coupled to each respective antenna element 110 by both horizontal and vertical antenna input/outputs. A first set of the circuits 114a-114k may be coupled together to form a first network that couples the circuits 112a-112m to a first input/output of the phased array antenna panel 100 configured to present/receive a horizontal RF signal (e.g., RFH). A second set of the circuits 114a-114k may be coupled together to form a second network that couples the circuits 112a-112m to a second input/output of the phased array antenna panel 100 configured to present/receive a vertical RF signal RFV.

Figure 3:
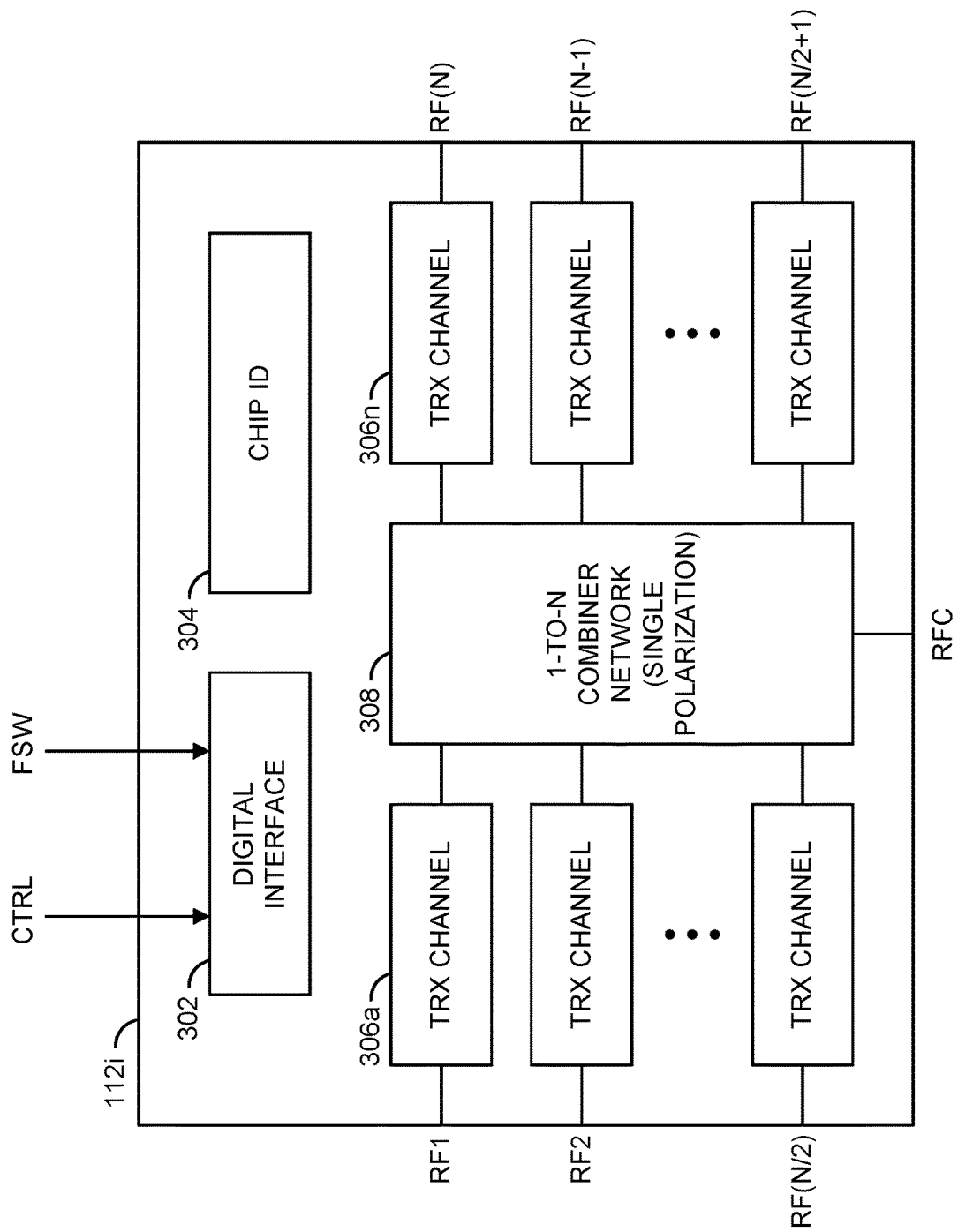
FIG. 3 is a diagram illustrating a single-polarization beam former circuit in accordance with an example embodiment of the invention.

Referring to FIG. 3, a diagram is shown illustrating an example implementation of a single-polarization beam former circuit 112i in accordance with an example embodiment of the invention. In an example, the single-polarization beam former circuit 112i may be representative of the single-polarization beam former circuits 112a-112m of FIG. 2. In an example, the single-polarization beam former circuit 112i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation.

In various embodiments, the signal RF may be presented/received by the common RF input/output RFC, and the antenna input/output ports RF1-RFN may be coupled to respective antenna elements 110. The single-polarization beam former circuit 112i generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting or receiving based upon the signal FSW.

The single-polarization beam former circuit 112i generally implements a transmit mode and a receive mode. In an example, a state of the signal FSW may determine whether the transmit mode or the receive mode is active. In the transmit mode, the single-polarization beam former circuit 112i is generally configured to receive the radio frequency signal RF at the common input/output port RFC and present radio frequency signals at the antenna input/output ports RF1-RFN. The signals presented at each of the antenna input/output ports RF1-RFN are generated by the single-polarization beam former circuit 112i in response to the radio frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 112i is generally configured to combine radio frequency signals received at the antenna input/output ports RF1-RFN for presentation as the signal RF at the common input/output port RFC.

The single-polarization beam former circuit 112i may comprise a block (or circuit) 302, a block (or circuit) 304, a number of blocks (or circuits) 306a-306n, and a block (or circuit) 308. The circuit 302 may implement an interface circuit. In various embodiments, the circuit 302 may implement a digital interface. The circuit 304 may implement a hard-wired address (e.g., chip ID) for the beam former circuit 112i. The circuits 306a-306n may implement transceiver (TRX) channels. The circuit 308 may implement a 1-to-N combiner/splitter network.

In an example, the signals FSW and CTRL are exchanged with the circuit 302. In an example, the circuit 302 may comprise a serial interface. The circuit 302 may be configured to be compliant with one or more serial interface standards including, but not limited to, serial peripheral interface (SPI), inter-integrated circuit (I$^2$C), daisy chain, etc. In an example, the circuit 302 may be configured to allow programming and control of the single-polarization beam former circuit 112i using a serial communication link (or bus). In an example, the circuit 302 may be configured to program and control the circuits 306a-306n in response to the signals CTRL and FSW. In an example, the circuit 302 may control whether the circuits 306a-306n operate in a transmit mode or a receive mode in response to the signal FSW. In an example, the circuit 302 may implement a 4-wire embedded SPI core. In an example, the circuit 304 may set a physical address of the beam former circuit 112i based upon hardware coded address bits (or pins). In some embodiments, the hard-wired address bits may be hard coded within the chip implementing the beam former circuit 112i. In some embodiments, the hard-wired address bits may be programmable within the chip implementing the beam former circuit 112i during manufacturing. In an example, the hard-wired address bits may be programmed using fuses, anti-fuses, or other conventional techniques.

In embodiments implementing a dual-polarization, the beam former circuit 112i may be implemented similarly, except that each transceiver channel may be configured to provide separate horizontal and vertical antenna input/outputs (e.g., RFH1 and RFV1, . . . , RFV(N) and RFV(N)), and the circuit 308 may be configured to couple the circuit 112i to separate horizontal and vertical common input/output ports (e.g., RFHC and RFVC).

Figure 4:
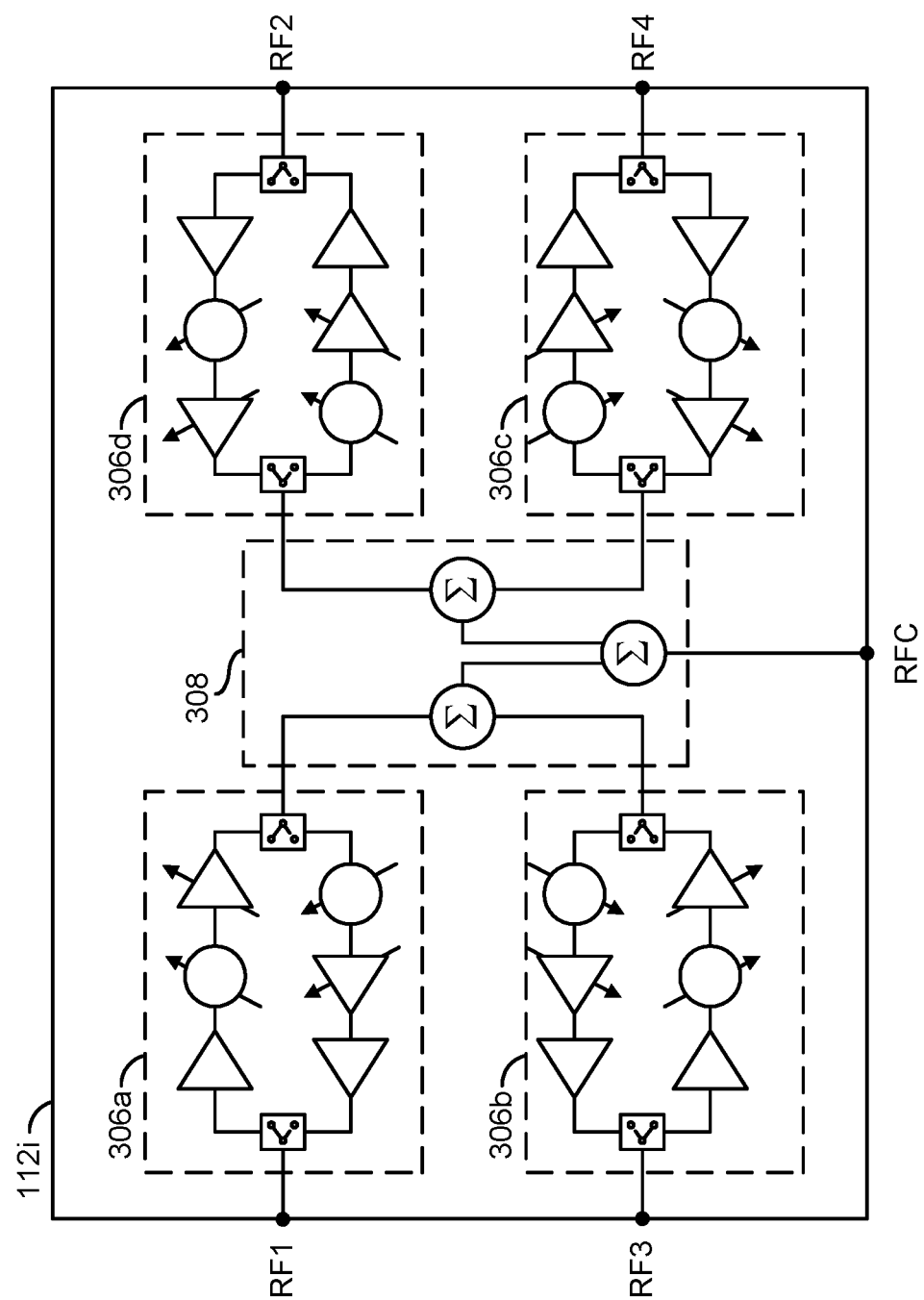
FIG. 4 is a diagram illustrating an example implementation of a generic 2×2 four-element single-polarization transceiver beam former circuit in accordance with an example embodiment of the invention.

Referring to FIG. 4, a diagram is shown illustrating an example implementation of a generic 2×2 four-element single-polarization transceiver beam former circuit 112i in accordance with an example embodiment of the invention. In various embodiments, beam former circuits may implement a plurality of transceiver channels. Each transceiver channel generally comprises a transmit channel and a receive channel. In an example, the 2×2 four-element single-polarization transceiver beam former circuit 112i may implement four transceiver channels 306a-306d. The four transceiver channels (or circuits) 306a-306d may be coupled to respective antenna elements in a group of adjacent antenna elements by corresponding bidirectional radio-frequency signals (e.g., RF1-RF4). The transceiver channels and antenna elements generally form a two-dimensional antenna network.

In an example, the circuit 308 may be implemented as a 1-4 combiner/splitter network. In an example, the circuit 308 may comprise a number of combiner/splitters. In an example, the combiner/splitters may be implemented as Wilkinson combiner/splitters. In various embodiments, the combiner/splitters may be coupled together to form a network that couples the circuits 306a-306d to a common RF input/output port RFC of the beam former circuit 112i. In the transmit mode, the circuit 308 is generally operational to distribute the power in a signal at the common RF input/output port RFC among the circuits 306a-306d. In the receive mode, the circuit 308 may be operational to combine the power received in signals from the circuits 306a-306d into a signal presented at the common RF input/output port RFC. The circuits 306a-306d and 308 are generally configured to provide a substantially equivalent path length between the common RF input/output port RFC and each of the circuits 306a-306d. The topology of the beam former circuit 112i may be scaled to provide other numbers of transceiver channels to meet the design criteria of a particular implementation.

In embodiments implementing dual-polarization phased array antenna panel, a 2×2 four-element dual-polarization transceiver beam former circuit may implement similarly to the transceiver beam former circuit 112i, except with two instances of the four transceiver channels 306a-306d and network 308: a first instance configured for the horizontal transceiver channels; and a second instance configured for the vertical channels.

Figure 5:
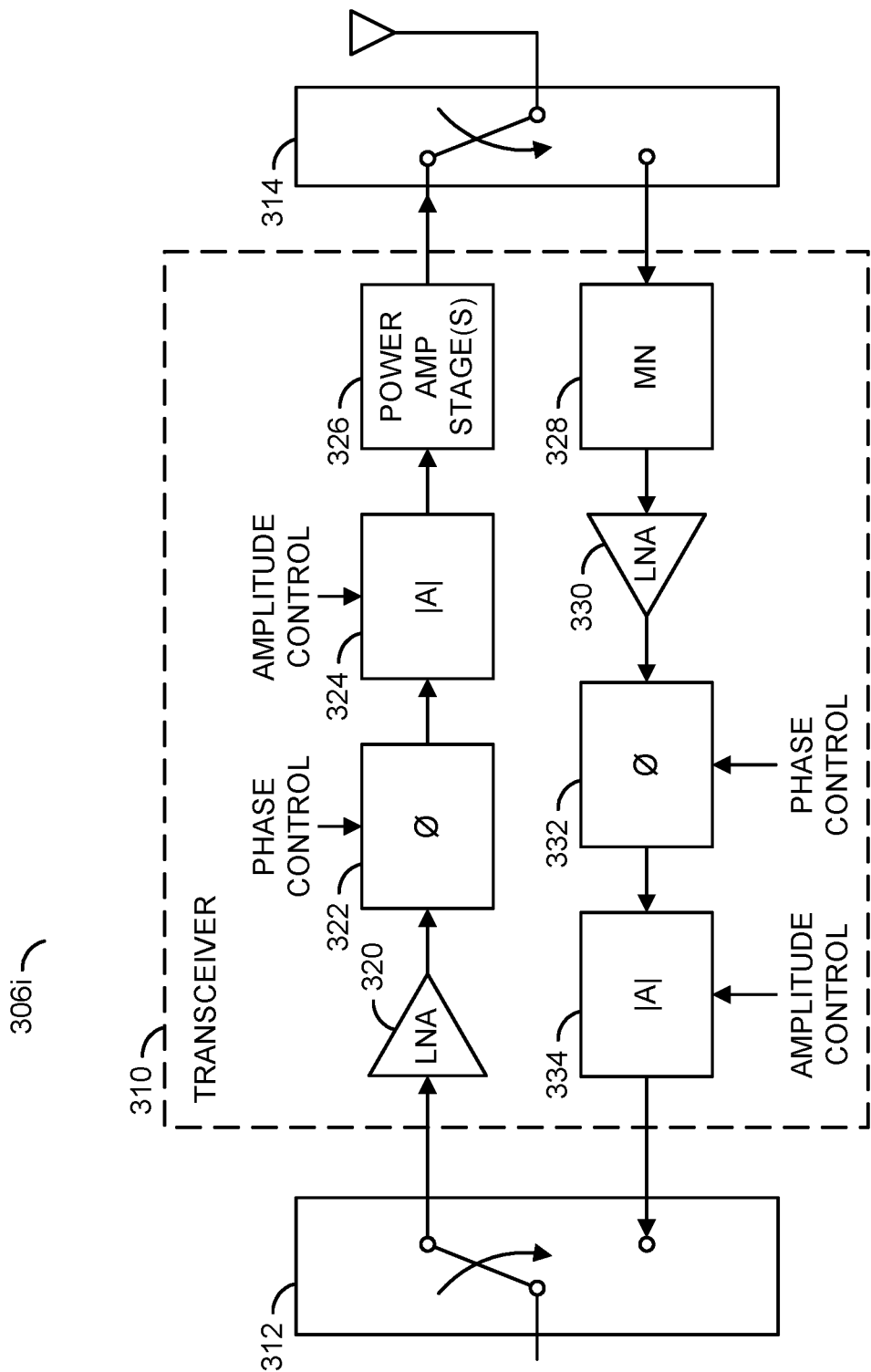
FIG. 5 is a diagram illustrating an example implementation of a transceiver channel with phase and amplitude controls and an output amplifier in accordance with an example embodiment of the invention.

Referring to FIG. 5, a block diagram of a transceiver circuit 306i is shown illustrating a example radio frequency (RF) amplifier application in accordance with an embodiment of the invention. In an example, the transceiver circuit 306i may be representative of the single-polarization beam former transceiver circuits (or channels) 306a-306d of FIG. 4. In another example, the transceiver circuit 306i may be representative of either horizontal or vertical beam former transceiver circuits (or channels) of a dual-polarization beam former circuit (or chip). In an example embodiment, the circuit 306i may comprise a block (or circuit) 310, a block (or circuit) 312, and a block (or circuit) 314. In an example embodiment, the circuit 310 may implement a transceiver circuit. The blocks 312 and 314 may implement transmit-receive (T/R) switches. A transceiver circuit is generally capable of both transmitting and receiving signals of a communication channel. In various embodiments, the circuit 310 may be capable of transmitting and receiving radio frequency (RF), microwave, and/or millimeter-wave signals.

In various embodiments, the circuit 310 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 310 may be representative of a radar application including, but not limited to target detection, ranging, and/or through-wall imaging. In an example, the transceiver circuit 310 generally comprises both a transmitter chain and a receiver chain. Both the transmitter chain and the receiver chain may comprise radio frequency (RF) amplifiers.

In an example, the transmitter chain may include an input amplifier 320, a variable (programmable) phase shifter 322, a variable (programmable) attenuator 324, and one or more output amplifier stages 326. In an example, the input amplifier 320 may be implemented as a low noise amplifier (LNA). The output amplifier stages 326 may include drivers, pre-amplifiers, and/or power amplifiers. In an example, the receiver chain may include a limiter (or protection) and filter (MN) circuit 328, a low noise amplifier (LNA) 330, a variable (programmable) phase shifter 332, and a variable (programmable) attenuator 334. In an example, an input of the transmitter chain and an output of the receiver chain may be coupled to a transmission line or an RF transceiver system by the RF switch 312. In an example, an output of the transmitter chain and an input of the receiver chain may be coupled to a transmission line or an antenna by the RF switch 314.

In various embodiments, the variable phase shifter 322, the variable attenuator 324, the variable phase shifter 332, and the variable attenuator 334 may be implemented using conventional techniques. In general, the amplifier circuits of the transceiver circuit 310 may provide improved linearity for wideband modulated signals by utilizing a bias network (or circuit) in accordance with an embodiment of the invention.

Figure 6:
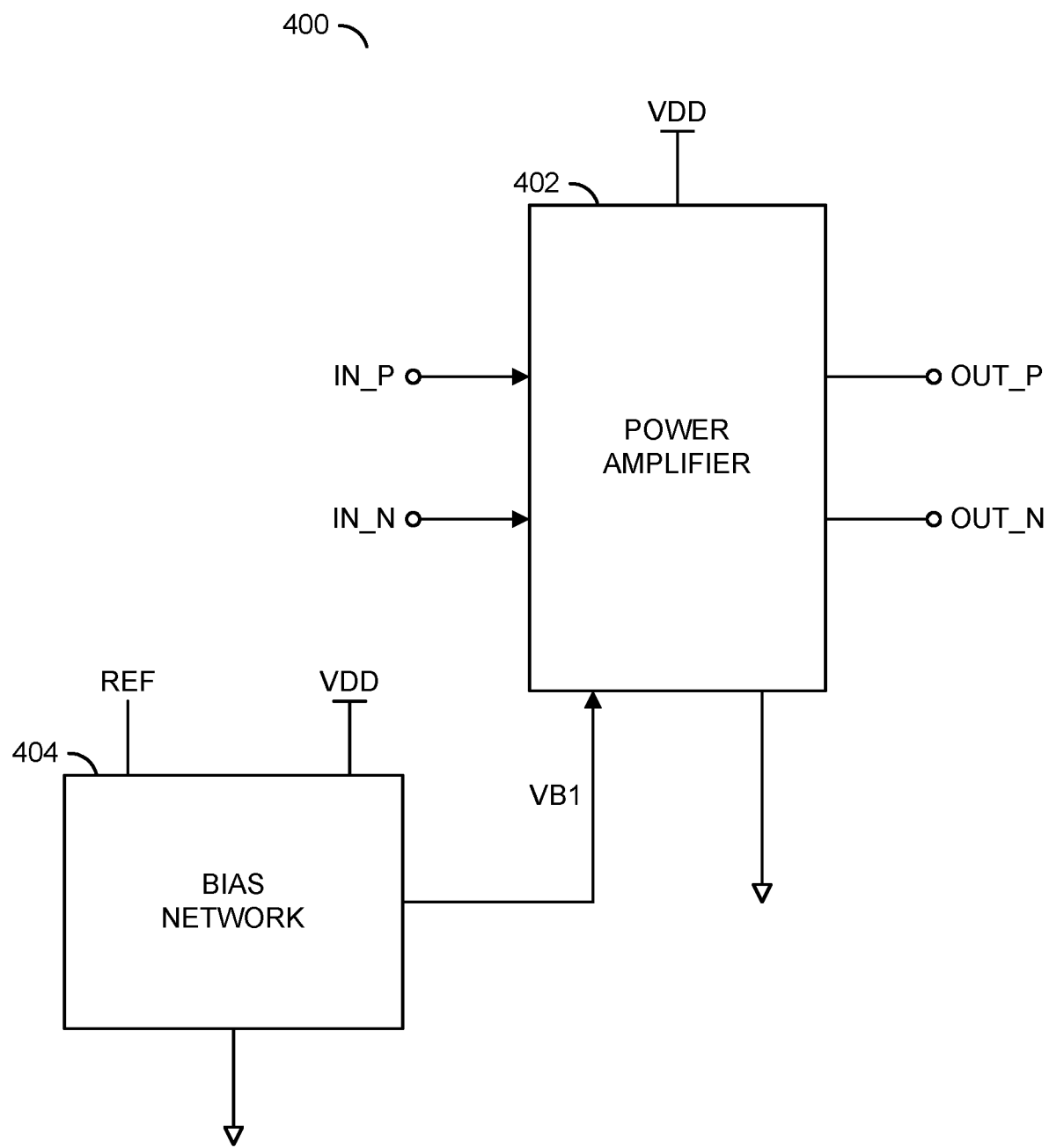
FIG. 6 is a diagram illustrating an example power amplifier circuit in accordance with an example embodiment of the invention.

Referring to FIG. 6, a block diagram of a circuit 400 is shown illustrating an amplifier implementing a bias network in accordance with an example embodiment of the invention. In various embodiments, the circuit 400 may be used to implement various amplifiers in millimeter-wave, microwave, and/or beam former chipsets. In an example, the circuit 400 may be used to implement one or more stages of the power amplifier 326. The circuit 400 may be implemented to simultaneously provide small signal matching as well as maximum power transfer (power matching) for millimeter-wave, microwave, and/or beam former power amplifiers.

In an example, the amplifier circuit 400 may comprise a power amplifier (PA) core (or circuit) 402 and a bias network (or circuit) 404. However, other types of amplifier core (e.g., LNA, etc.) may be implemented accordingly to meet the design criteria of a particular application. In various embodiments, the bias network 404 is configured to improve linearity for wideband modulated signals used in millimeter-wave, microwave, and/or beam former power amplifiers driving phased array antenna panels.

In an example, the amplifier circuit 402 may have a differential input, comprising a positive (true) input (+) and a negative (complementary) input (−), a differential output comprising a positive (true) output and a negative (complementary) output, and a bias input. In an example, a signal (e.g., IN_P) may be presented to the positive input, a signal (e.g., IN_N) may be presented to the negative input, a bias signal (e.g., VB1) may be presented to the bias input, a signal (e.g., OUT_P) may be presented at the positive output, and a signal (e.g., OUT_N) may be presented at the negative output. The signals IN_P and IN_N may be components of a differential input signal. The signals OUT_P and OUT_N may be components of a differential output signal. The signal VB1 may be a bias reference voltage. The bias input at which the signal VB1 is applied may be referred to as a biasing node of the amplifier circuit 402. The biasing node is generally an internal circuit node, which is generally not measurable, but the impedance level may be checked through simulation. The amplifier circuit 402 may be configured to generate the signals OUT_P and OUT_N in response to the signals IN_P, IN_N, and VB1.

In an example, the circuit 404 may be configured to generate the bias reference voltage VB1 in response to a bias reference signal (e.g., REF). In various embodiments, the bias reference signal may be implemented as either a current or a voltage. In traditional power amplifier biasing circuits, a current (e.g., I_REF) may be used to create a voltage drop (e.g., VB1) on a diode connected transistor device. The voltage drop may be used to bias power amplifier core transistors. In an example, a traditional bias network may comprise a metal oxide semiconductor field effect transistor (MOSFET), a bi-polar junction transistor (BJT), a resistor, and a capacitor. A drain terminal of the MOSFET may be tied to a power supply voltage (e.g., VDD). The signal I_REF may be presented to a node formed by connection of a gate terminal of the MOSFET and a collector terminal of the BJT. An emitter terminal of the BJT may be connected to the circuit ground potential. A base terminal of the BJT may be coupled by the resistor to a source terminal of the MOSFET. The source terminal of the MOSFET may be coupled by the capacitor to a circuit ground potential. The bias voltage VB1 may be presented at a node formed by connection of the source terminal of the MOSFET, a terminal of the resistor, and a terminal of the capacitor. In an example, the BJT may be implemented as a heterojunction bipolar transistor (HBT). In general, the BJT may be implemented using transistors similar to transistors used to implement the power amplifier circuit 402.

When coupled to the biasing node of the power amplifier (PA) circuit 402, the traditional bias network generally exhibits baseband memory effects under wideband modulated signals due to baseband impedance variation over the modulation bandwidth at the biasing node of the PA circuit 402. In various embodiments, the bias network (or circuit) 404 implemented in accordance with embodiments of the invention may utilize an operational amplifier (or opamp) with low output impedance instead of a MOSFET device. The operational amplifier generally acts to maintain a substantially constant impedance at the biasing node VB1 up to a modulated signal bandwidth (e.g., 800 MHz, etc.).

In various embodiments, the bias circuit 404 is generally configured to dynamically adjust the bias voltage reference VB1 presented at the biasing node of the amplifier circuit 402 to maintain a low baseband impedance, which provides improved linearity for wideband modulated signals. In an example, power amplifier linearity may be specified using a third order intercept point (IP3 or TOI) characteristic, as it affects power efficiency, channel density, signal coverage, and adjacent channel power ratio (ACPR). Adjacent channel power ratio (ACPR), also known as adjacent channel leakage ratio (ACLR), is an important metric for components designed for use in wireless communications standards. Determining the desired impedance generally involves balancing (or a trade off) of the power amplifier linearity specification, any power amplifier balun asymmetry, and other asymmetries that may contribute to a common mode signal at the biasing node. In an example, an impedance of a few tens of ohms (e.g., about 30 ohms, etc.) may be acceptable.

Figure 7:
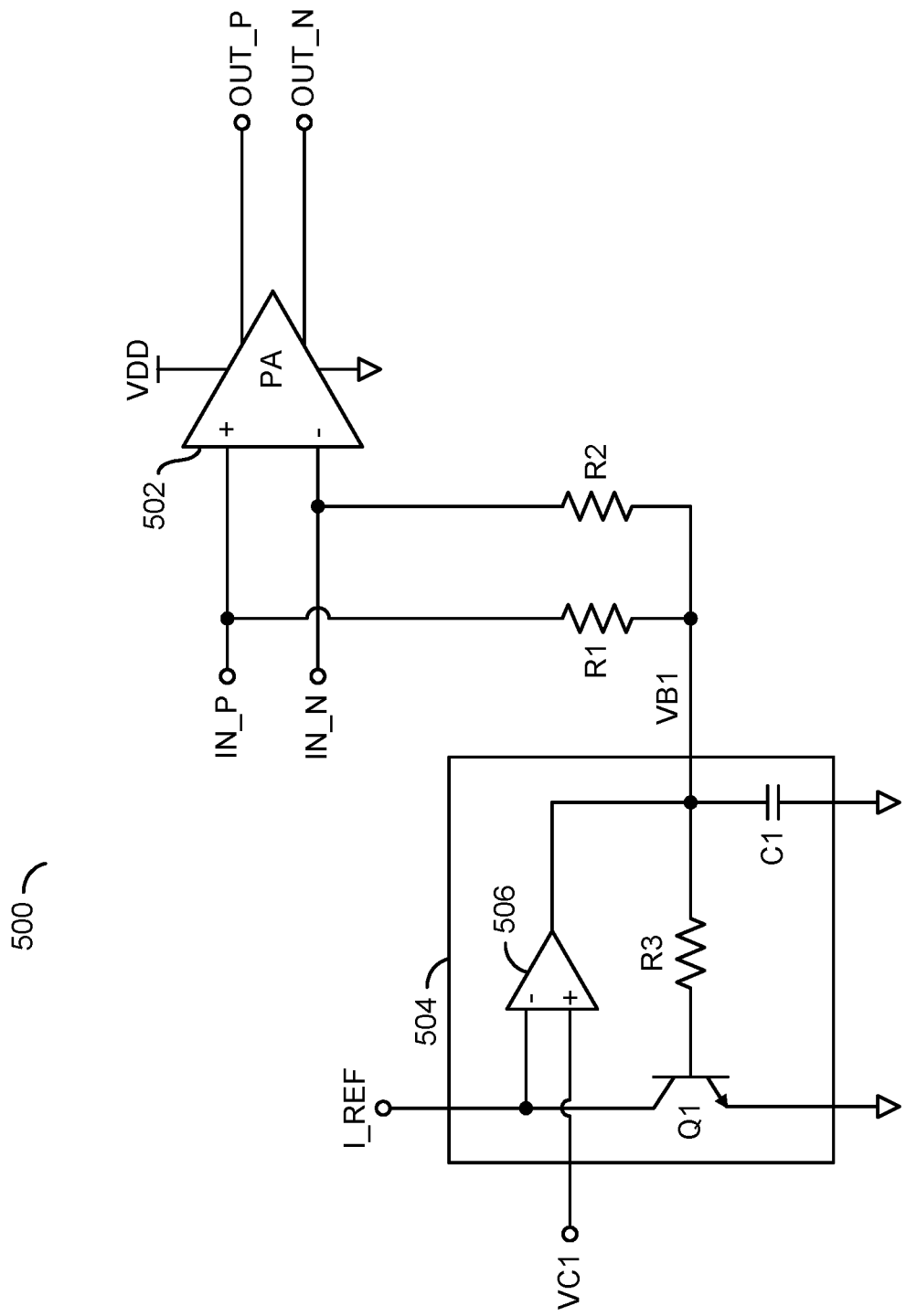
FIG. 7 is a diagram illustrating an example implementation of a power amplifier bias circuit in accordance with an example embodiment of the invention.

Referring to FIG. 7, a diagram of a circuit 500 is shown illustrating an example implementation of a differential amplifier implementing a bias network in accordance with an example embodiment of the invention. In various embodiments, the circuit 500 may be used to implement various amplifiers in millimeter-wave, microwave, and/or beam former chipsets. In an example, the circuit 500 may comprise a block (or circuit) 502 and a block (or circuit) 504. In an example, the block 502 may implement a differential power amplifier (PA). In an example, the PA 502 may implement one or more amplifier stages. In an example, the block 504 may implement a bias network (or circuit). The biasing technique illustrated in FIG. 7 may be used with any PA topology, including, but not limited to, single-ended, differential, common-emitter, cascade, and stacked amplifiers.

In an example, the amplifier 502 may have a differential input, comprising a positive (true) input (+) and a negative (complementary) input (−), and a differential output comprising a positive (true) output and a negative (complementary) output. In an example, the signal IN_P may be presented to the positive input, the signal IN_N may be presented to the negative input, the signal OUT_P may be presented at the positive output, and the signal OUT_N may be presented at the negative output. The signals IN_P and IN_N may be components of a differential input signal. The signals OUT_P and OUT_N may be components of a differential output signal.

In an example, the amplifier 502 may be biased using a couple of resistors. A resistor R1 may have a first terminal connected to the positive input of the amplifier 502 and a second terminal configured to receive the bias voltage VB1. A resistor R2 may have a first terminal connected to the negative input of the amplifier 502 and a second terminal configured to receive the bias voltage VB1. A node formed by the connection of the second terminals of the resistors R1 and R2 may be referred to as a biasing node of the amplifier 502. The amplifier 502 may be configured to generate the signals OUT_P and OUT_N in response to the signals IN_P, IN_N, and VB1.

In an example, the circuit 504 may be configured to generate the bias voltage VB1 in response to a bias reference current signal (e.g., I_REF). In an example, the circuit 504 may comprise an operational amplifier (opamp) 506, a bi-polar junction transistor Q1, a resistor R3, and a capacitor C1. The signal I_REF may be presented to a node formed by connection of a negative input of the opamp 506 and a collector terminal of the transistor Q1. An emitter terminal of the transistor Q1 may be connected to the circuit ground potential. A base terminal of the transistor Q1 may be coupled to a first terminal of the resistor R3. A second terminal of the resistor R3 may be coupled to an output of the opamp 506 and a first terminal of the capacitor C1. A second terminal of the capacitor C1 may be connected to the circuit ground potential. The bias voltage VB1 may be presented at a node formed by connection of the output of the opamp 506, the second terminal of the resistor R3, and the first terminal of the capacitor C1.

In an example, the opamp 506 may be implemented as a wideband (e.g., >500 MHz) operational amplifier with low output impedance. In general, the output impedance of the operational amplifier should be as low as possible. The low output impedance generally reduces the common-mode voltage swing at the bias node, which helps to improve PA linearity. In an example, an output impedance for the bias circuit 504 of a few tens of ohms is generally acceptable. In various embodiments, the opamp 506 may be implemented as any high gain and high bandwidth amplifier with a high input impedance differential input stage and a low output impedance output stage.

In an example, the transistor Q1 may be implemented as a heterojunction bipolar transistor (HBT). However, other types of transistors (e.g., pHEMT, MOSFET, etc.) may be implemented accordingly to meet design criteria of a particular implementation. In general, the transistor Q1 may be implemented using transistors similar to transistors used to implement the power amplifier 502. The opamp 506 may be implemented with bipolar devices as well as complementary metal oxide semiconductor (CMOS) devices. In embodiments where a frequency specification is only up to about 1 GHz, implementing the opamp 506 with CMOS technology may be a preferable approach. In embodiments where higher performance is desired, the opamp 506 may be implemented using bipolar devices. In an example, CMOS may be used for the input differential pair and a bipolar device may be used for the output stage for providing lower output impedance.

In an example, the opamp 506 and output capacitance provided by the capacitor C1 generally combine to provide lower impedance over the modulated signal bandwidth. In an example, the capacitor C1 may be selected to provide acceptable impedance above 200 MHz, but at lower frequencies the capacitor C1 may present higher impedance. In the example where the capacitor C1 is selected to provide acceptable impedance above 200 MHz, the opamp 506 may be designed such that a low impedance is provided up to 200 MHz. In general, both mechanisms (the opamp 506 and the capacitor C1) may be configured to work together to provide a low baseband impedance at the biasing node at which the signal VB1 is presented over the full operating frequency range of the amplifier.

There is generally a tradeoff between the capacitance at the biasing node (e.g., the capacitor C1) and the bandwidth of the opamp 506. For example, if a 10 pF capacitance is chosen, then an impedance of about 32 ohms at 500 MHz is provided. The impedance is inversely proportional to frequency, thus, the impedance increases at lower frequencies. In various embodiments, the bias network 504 may be designed to have an output impedance of less than 32 ohms from DC to 500 MHz, ensuring that impedance is low across the expected bandwidth. If a larger capacitance is implemented, the bandwidth of the opamp 506 may be reduced. In an example, 32 ohms is a practical choice, which may depend on other design parameters as stated above.

In various embodiments, the node at which the signal VB1 is presented generally has a substantially constant impedance up to the modulated signal bandwidth. Above the modulated signal bandwidth, the capacitor C1 is generally selected to start taking over to lower the impedance level. In an example, a modulated signal bandwidth of about 800 MHz may be implemented, while the carrier frequency may be in a range of frequencies (e.g., 22-26 GHz, 24-30 GHz, 33-37 GHz, etc.). In an example, a 26 GHz band (e.g., 24.25 GHz to 27.5 GHz) signal with the 800 MHz modulated signal bandwidth may cover a frequency range from 25 GHz to 25.8 GHz. In some embodiments, the modulated signal bandwidth may be lower than 800 MHz (e.g., 400 MHz, 200 MHz, or even lower). In some embodiments, the modulated signal bandwidth may be higher. In an example, the 5G standard currently allows of maximum single channel bandwidth of about 400 MHz. However, updates to the 5G standard and/or future standards may increase the maximum single channel bandwidth. In another example, an operator may want to aggregate multiple channels in a single signal of higher bandwidth.

In an example, a voltage (e.g., VC1) may be applied to a positive input of the opamp 506. The voltage VC1 may be used to set a $V_{CE}$ diode voltage level of the transistor Q1. The voltage VC1 is typically chosen such that the transistor Q18 is biased in an active region of operation across all operating conditions. In an example, the voltage VC1 may be selected close to the collector voltage of the transistors Q10 and Q12, so that the current mirror operation works well.

Figure 8:
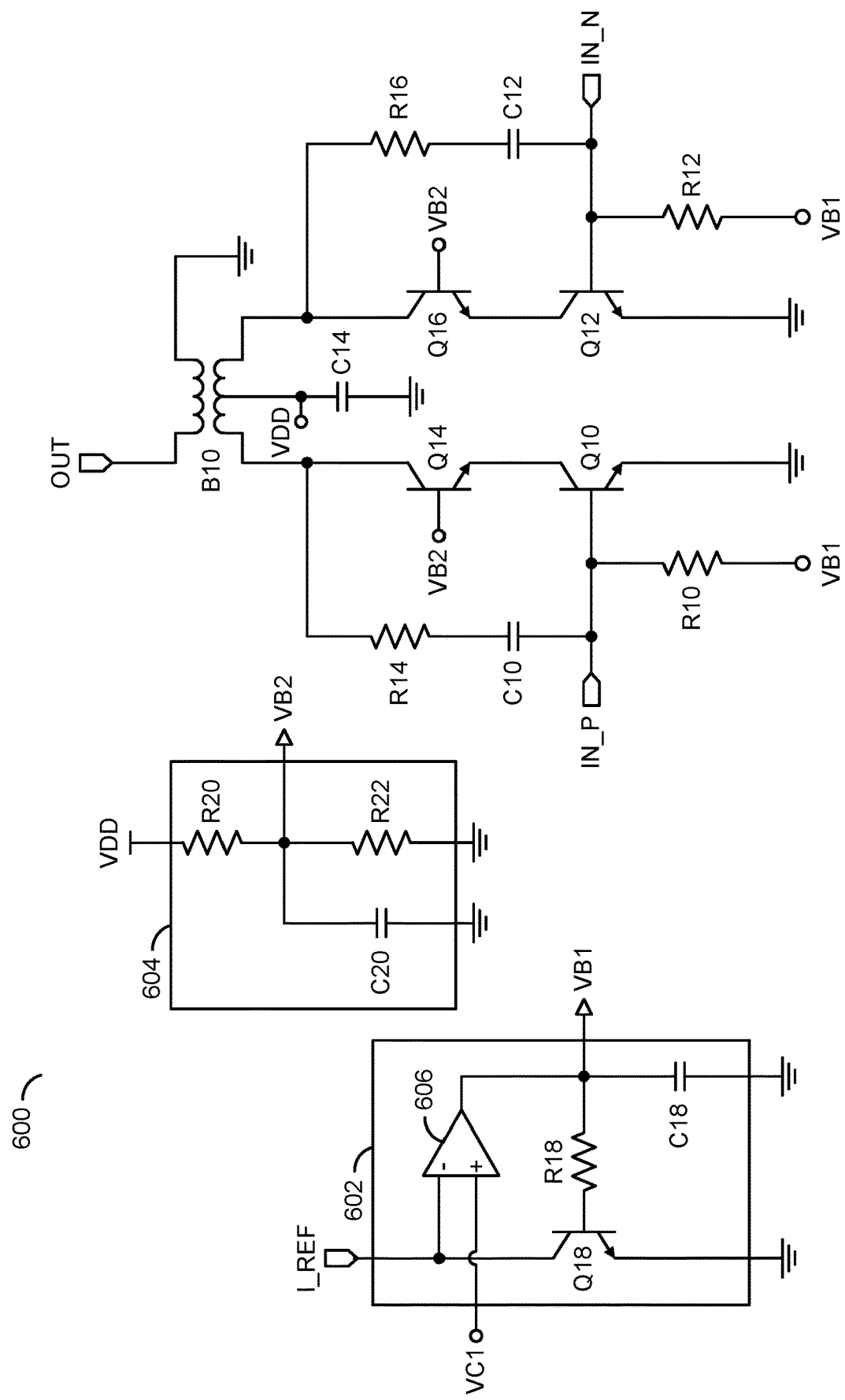
FIG. 8 is a diagram illustrating another example implementation of a power amplifier with a bias voltage generator circuit in accordance with an example embodiment of the invention.

Referring to FIG. 8, a diagram of a circuit 600 is shown illustrating another example implementation of a power amplifier with a bias network in accordance with an example embodiment of the invention. In an example, the circuit 600 may be implemented comprising a cascade single stage power amplifier core, a first bias circuit 602, and a second bias circuit 604. The bias circuit 602 may be configured to generate the bias voltage VB1 in response to the signal I_REF. The bias circuit 602 may be implemented similarly to the circuit 504 (described above in connection with FIG. 7). The bias circuit 604 may be configured to generate a bias voltage (e.g., VB2) in response to a power supply voltage (e.g., VDD).

In an example, the power amplifier core of the circuit 600 may comprise a transistor Q10, a transistor Q12, a transistor Q14, a transistor Q16, a resistor R10, a resistor R12, a resistor R14, a resistor R16, a capacitor C10, and a capacitor C12. In an example, the transistors Q10, Q12, Q14, and Q16 may be implemented as heterojunction bipolar transistors. However, other types of transistors (e.g., pHEMT, MOSFET, etc.) may be used accordingly to meet the design criteria of a particular implementation. An emitter terminal of transistor Q10 may be connected to the circuit ground potential. An emitter terminal of transistor Q12 may be connected to the circuit ground potential. The resistor R10 may have a first terminal connected to a base terminal of the transistor Q10 and a second terminal configured to receive the bias voltage VB1. The resistor R12 may have a first terminal connected to a base terminal of the transistor Q12 and a second terminal configured to receive the bias voltage VB1. A collector terminal of the transistor Q10 may be connected to an emitter terminal of the transistor Q14. A collector terminal of the transistor Q12 may be connected to an emitter terminal of the transistor Q16. The bias voltage VB2 may be presented to a base terminal of the transistor Q14 and a base terminal of the transistor Q16. A collector terminal of the transistor Q14 may be coupled to the base terminal of the transistor Q10 by an RC feedback network formed by the resistor R14 and the capacitor C10. A collector terminal of the transistor Q16 may be coupled to the base terminal of the transistor Q12 by an RC feedback network formed by the resistor R16 and the capacitor C12.

In an example, the input signal IN_P may be presented to the base terminal of the transistor Q10. The input signal INN may be presented to the base terminal of the transistor Q12.

The signals IN_P and IN_N may be components of a differential input signal. A first output signal of the amplifier may be presented at a node formed by connection of the collector terminal of the transistor Q14 and a terminal of the resistor R14. A second output signal of the amplifier may be presented at a node formed by connection of the collector terminal of the transistor Q16 and a terminal of the resistor R16.

In an example, the outputs of the amplifier circuit may connected to a balun B10 to achieve a single-ended output (e.g., OUT) in response to the differential input. In an example, the collector terminal of the transistor Q14 and the collector terminal of the transistor Q16 may be connected to an input winding of the balun B10. The power supply voltage VDD may be presented to a center tap of the input winding of the balun B11. The capacitor C14 may be coupled between the center tap of the input winding of the balun B10 and the circuit ground potential.

In an example, the circuit 602 may comprise an operational amplifier (opamp) 606, a bipolar junction transistor Q18, a resistor R18, and a capacitor C18. The opamp 606 may be implemented similarly to the opamp 506 (described above in connection with FIG. 7). The signal I_REF may be presented to a node formed by connection of a negative input of the opamp 606 and a collector terminal of the transistor Q18. The voltage VC1 may be presented to a positive input of the opamp 606. An emitter terminal of the transistor Q18 may be connected to the circuit ground potential. A base terminal of the transistor Q18 may be coupled to a first terminal of the resistor R18. A second terminal of the resistor R18 may be coupled to an output of the opamp 606 and a first terminal of the capacitor C18. A second terminal of the capacitor C18 may be connected to the circuit ground potential. The bias voltage VB1 may be presented at a node formed by connection of the output of the opamp 606, the second terminal of the resistor R18, and the first terminal of the capacitor C18. In an example, the transistor Q18 may be implemented as a heterojunction bipolar transistor. However, other types of transistors may be implemented to meet design criteria of a particular implementation. In general, the transistors Q10, Q12, Q14, Q16, and Q18 are implemented using similar types of transistors.

In an example, the circuit 604 may comprise a resistor R20, a resistor R22, and a capacitor C20. In various embodiments, the circuit 604 provides bias for the cascode node of the power amplifier core. A first terminal of the resistor R20 may be tied to the power supply voltage VDD. A second terminal of the resistor R20 may be connected to a first terminal of the resistor R22 and a first terminal of the capacitor C20. A second terminal of the resistor R22 may be connected to the circuit ground potential. A second terminal of the capacitor C20 may be connected to the circuit ground potential. The signal VB2 may be presented at a node formed by the connection of the resistor R20, the resistor R22, and the capacitor C20.

Figure 9:
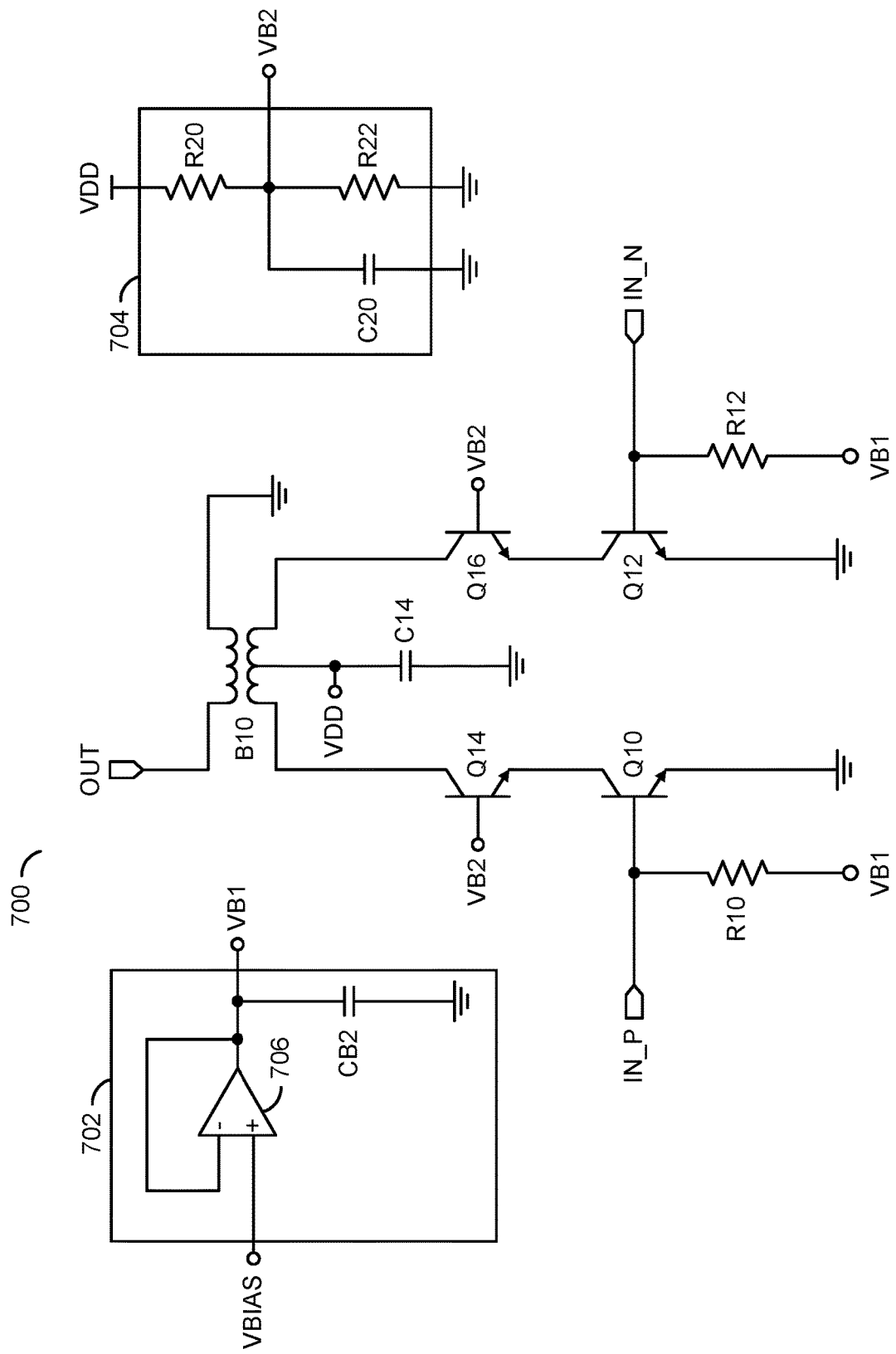
FIG. 9 is a diagram illustrating another example implementation of a power amplifier with a bias voltage generator circuit in accordance with an example embodiment of the invention.

Referring to FIG. 9, a diagram of a circuit 700 is shown illustrating another example implementation of a power amplifier with bias network in accordance with an example embodiment of the invention. In some embodiments, the bias voltage reference VB1 may be generated using a unity-gain operational amplifier. In an example, the circuit 700 may be implemented comprising a cascade single stage power amplifier core, a first bias circuit 702, and a second bias circuit 704. The bias circuit 702 may be configured to generate the bias voltage VB1 in response to a bias reference voltage signal (e.g., VBIAS). The bias circuit 704 may be implemented similarly to the bias circuit 604 (described above in connection with FIG. 8). The bias circuit 704 may be configured to generate the bias voltage VB2 in response to a power supply voltage VDD.

The power amplifier core of the circuit 700 may be implemented similarly to the power amplifier core of the circuit 600, except that the feedback networks may be omitted. In an example, the power amplifier core of the circuit 700 comprises the transistor Q10, the transistor Q12, the transistor Q14, the transistor Q16, the resistor R10, the resistor R12, and the capacitor C14. In an example, the transistors Q10, Q12, Q14, and Q16 may be implemented as heterojunction bipolar transistors. However, other types of transistors (e.g., pHEMT, MOSFET, etc.) may be used accordingly to meet the design criteria of a particular implementation. An emitter terminal of transistor Q10 may be connected to the circuit ground potential. An emitter terminal of transistor Q12 may be connected to the circuit ground potential. The resistor R10 may have a first terminal connected to a base terminal of the transistor Q10 and a second terminal configured to receive the bias voltage VB1. The resistor R12 may have a first terminal connected to a base terminal of the transistor Q12 and a second terminal configured to receive the bias voltage VB1. A collector terminal of the transistor Q10 may be connected to an emitter terminal of the transistor Q14. A collector terminal of the transistor Q12 may be connected to an emitter terminal of the transistor Q16. The bias voltage VB2 may be presented to a base terminal of the transistor Q14 and a base terminal of the transistor Q16. In an example, a collector terminal of the transistor Q14 and a collector terminal of the transistor Q16 may be connected to the balun B10 to achieve the single-ended output (e.g., OUT). The power supply voltage VDD may be presented to a center tap of an input winding of the balun B10. The capacitor C14 may be coupled between the center tap of the input winding of the balun B11 and the circuit ground potential.

In an example, the input signal IN_P may be presented to the base terminal of the transistor Q10. The input signal IN_N may be presented to the base terminal of the transistor Q12. The signals IN_P and IN_N may be components of a differential input signal. A first output signal of the amplifier may be presented at the collector terminal of the transistor Q14. A second output signal of the amplifier may be presented at the collector terminal of the transistor Q16.

In an example, the circuit 702 may comprise an operational amplifier (opamp) 706 and a capacitor CB2. The opamp 706 may be implemented similarly to the opamp 506 (described above in connection with FIG. 7). The signal VBIAS may be presented to a positive input of the opamp 706. An output of the opamp 706 may be connected to a negative input of the opamp 706 to configure the opamp 706 as a unity gain amplifier. A first terminal of the capacitor CB2 may be coupled to the output of the opamp 706. A second terminal of the capacitor CB2 may be connected to the circuit ground potential. The bias voltage VB1 may be presented at a node formed by connection of the output of the opamp 706 and the first terminal of the capacitor CB2. As discussed above in connection with FIG. 7, there is generally a tradeoff between the capacitance at the biasing node (e.g., the capacitor CB2) and the bandwidth of the opamp 706. In various embodiments, the bias network 704 may be designed to have a low output impedance (e.g., a few tens of ohms from DC to 500 MHz), ensuring impedance is low across the expected bandwidth of the modulated signal.

In various embodiments, the node at which the signal VB1 is presented generally has a substantially constant impedance up to about the modulated signal bandwidth (e.g., 800 MHz, etc.). Above the modulated signal bandwidth, the capacitor CB2 is generally chosen to start taking over to lower the impedance level. The voltage VBIAS generally sets the voltage level of the bias node VB1. The voltage VBIAS generally determines the DC bias operating point of the PA 700. The node at which the voltage VBIAS is presented is a sensitive node because variation on this line may reflect exponential change in the PA bias current. In an example, the voltage VBIAS may also be generated using a resistive voltage divider or any other voltage generating circuit. In another example, the voltage VBIAS may be generated using a diode connected mirror device (as described below in connection with the circuit 802 in FIG. 10), which may provide a more stable DC collector current for the PA 700.

In an example, the circuit 704 may comprise the resistor R20, the resistor R22, and the capacitor C20. In various embodiments, the circuit 704 provides bias for the cascode node of the power amplifier core of the circuit 700. A first terminal of the resistor R20 may be tied to the power supply voltage VDD. A second terminal of the resistor R20 may be connected to a first terminal of the resistor R22 and a first terminal of the capacitor C20. A second terminal of the resistor R22 may be connected to the circuit ground potential. A second terminal of the capacitor C20 may be connected to the circuit ground potential. The signal VB2 may be presented at a node formed by the connection of the resistor R20, the resistor R22, and the capacitor C20.

Figure 10:
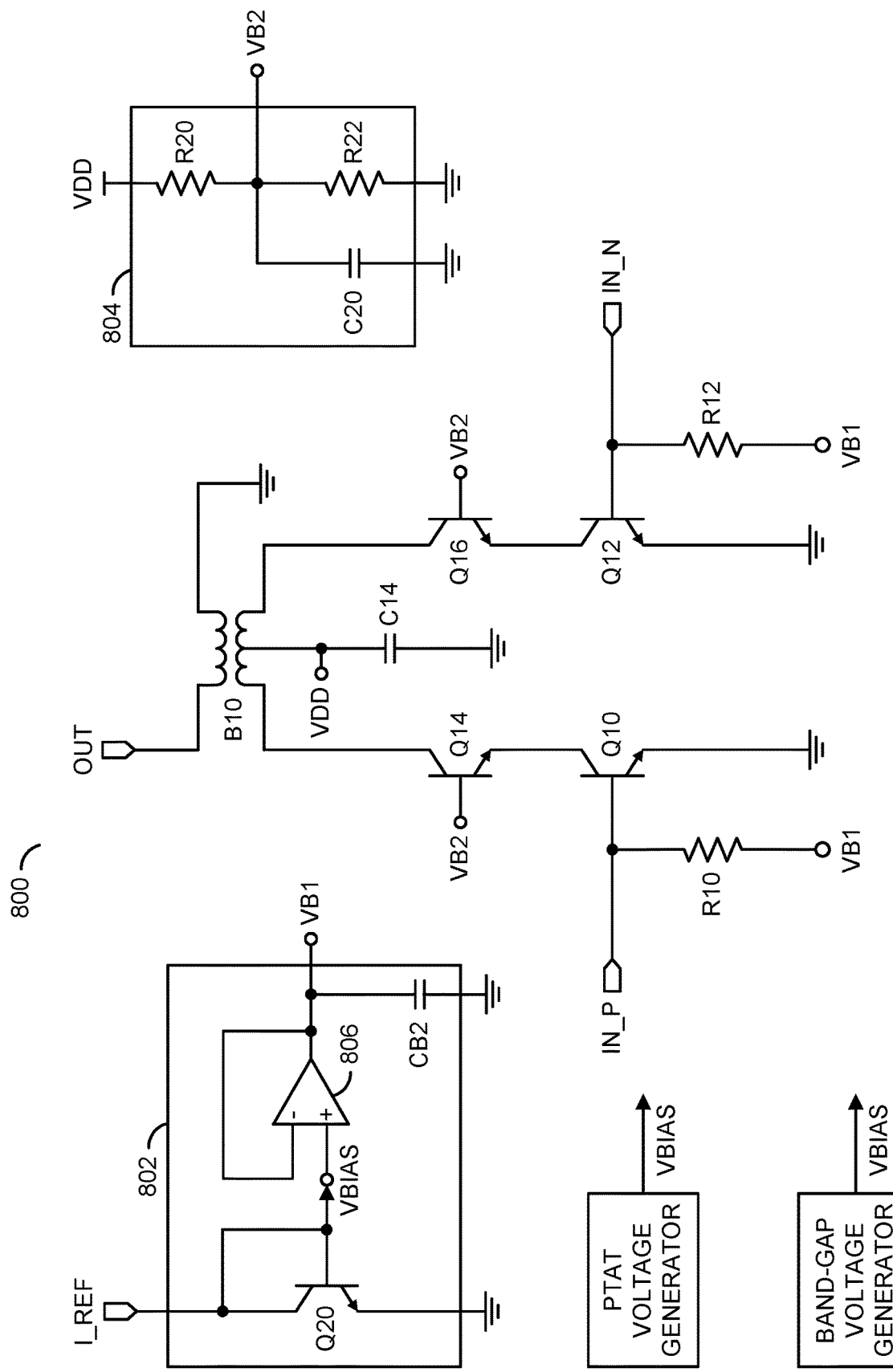
FIG. 10 is a diagram illustrating another example implementation of a power amplifier with a bias voltage generator circuit in accordance with an example embodiment of the invention.

Referring to FIG. 10, a diagram of a circuit 800 is shown illustrating still another example implementation of a power amplifier with bias network in accordance with an example embodiment of the invention. In some embodiments, the bias voltage reference may be generated using a unity-gain operational amplifier tied to a diode-connected transistor, a band-gap voltage generator, or a proportional to absolute temperature (PTAT) voltage generator. In an example, the circuit 800 may be implemented comprising a cascade single stage power amplifier core, a first bias circuit 802, and a second bias circuit 804. The bias circuit 802 may be configured to generate the bias voltage VB1 in response to a bias reference current signal (e.g., I_REF). The power amplifier core of the circuit 800 may be implemented similarly to the amplifier core of the circuit 700 (described above in connection with FIG. 9). The bias circuit 804 may be implemented similarly to the bias circuits 604 and 704 (described above in connection with FIGS. 8 and 9). The bias circuit 804 may be configured to generate the bias voltage VB2 in response to a power supply voltage VDD.

In an example, the power amplifier core of the circuit 800 comprises the transistor Q10, the transistor Q12, the transistor Q14, the transistor Q16, the resistor R10, the resistor R12, and the capacitor C14. In an example, the transistors Q10, Q12, Q14, and Q16 may be implemented as heterojunction bipolar transistors. However, other types of transistors (e.g., pHEMT, MOSFET, etc.) may be used accordingly to meet the design criteria of a particular implementation. An emitter terminal of transistor Q10 may be connected to the circuit ground potential. An emitter terminal of transistor Q12 may be connected to the circuit ground potential. The resistor R10 may have a first terminal connected to a base terminal of the transistor Q10 and a second terminal configured to receive the bias voltage VB1. The resistor R12 may have a first terminal connected to a base terminal of the transistor Q12 and a second terminal configured to receive the bias voltage VB1. A collector terminal of the transistor Q10 may be connected to an emitter terminal of the transistor Q14. A collector terminal of the transistor Q12 may be connected to an emitter terminal of the transistor Q16. The bias voltage VB2 may be presented to a base terminal of the transistor Q14 and a base terminal of the transistor Q16. In an example, a collector terminal of the transistor Q14 and a collector terminal of the transistor Q16 may be connected to the balun B10 to achieve a single-ended output (e.g., OUT). The power supply voltage VDD may be presented to a center tap of an input winding of the balun B10. The capacitor C14 may be coupled between the center tap of the input winding of the balun B10 and the circuit ground potential.

In an example, the input signal IN_P may be presented to the base terminal of the transistor Q10. The input signal IN_N may be presented to the base terminal of the transistor Q12. The signals IN_P and IN_N may be components of a differential input signal. A first output signal of the amplifier may be presented at the collector terminal of the transistor Q14. A second output signal of the amplifier may be presented at the collector terminal of the transistor Q16.

In an example, the circuit 802 may comprise an operational amplifier (opamp) 806, a transistor Q20, and the capacitor CB2. The opamp 806 may be implemented similarly to the opamp 506 (described above in connection with FIG. 7). The transistor Q20 may be diode connected (e.g., a collector terminal of the transistor Q20 connected to a base terminal of the transistor Q20). The signal IREF may be presented to a node formed by connection of the collector terminal of the transistor Q20, the base terminal of the transistor Q20, and a positive input of the opamp 806. An output of the opamp 806 may be connected to a negative input of the opamp 806, configuring the opamp 806 as a unity gain amplifier. A first terminal of the capacitor CB2 may be coupled to the output of the opamp 806. A second terminal of the capacitor CB2 may be connected to the circuit ground potential. The bias voltage VB1 may be presented at a node formed by connection of the output of the opamp 806 and the first terminal of the capacitor CB2. In an example, the transistor Q20 may be implemented as a heterojunction bipolar transistor. However, other types of transistors may be utilized to implement the transistor Q20 to meet design criteria of a particular implementation. In general, the transistors Q10, Q12, Q14, Q16, and Q20 are implemented using similar types of transistors. In an example, the node at which the signal VB1 is presented generally has a substantially constant impedance up to a modulated signal bandwidth (e.g., 800 MHz, etc.).

In an example, the circuit 804 may comprise the resistor R20, the resistor R22, and the capacitor C20. In various embodiments, the circuit 804 provides bias for the cascode node of the power amplifier core of the circuit 800. A first terminal of the resistor R20 may be tied to the power supply voltage VDD. A second terminal of the resistor R20 may be connected to a first terminal of the resistor R22 and a first terminal of the capacitor C20. A second terminal of the resistor R22 may be connected to the circuit ground potential. A second terminal of the capacitor C20 may be connected to the circuit ground potential. The signal VB2 may be presented at a node formed by the connection of the resistor R20, the resistor R22, and the capacitor C20.

In traditional biasing circuitry, baseband impedance at the biasing node VB1 has large variation and peaks at around 300 MHz. The variation generally appears as OIP3 degradation. A two-tone test generally shows the performance degradation clearly (~4 dB dip). In contrast to traditional biasing circuitry, a bias circuit in accordance with an embodiment of the present invention generally maintains the baseband impedance substantially constant up to about the modulated signal bandwidth. As a result, the OIP3 of a bias circuit in accordance with an embodiment of the present invention generally has a flat response which is more suitable for wideband modulated systems (e.g., 5G and beyond).

Although embodiments of the invention have been described in the context of a RF application, the present invention is not limited to RF applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, 5G) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   an amplifier circuit; and
   a bias circuit, wherein said bias circuit is configured to dynamically adjust a bias voltage reference at a bias node connected to one or more input transistors of said amplifier circuit to maintain a low baseband impedance, said bias circuit comprises an operational amplifier configured as a unit-gain operational amplifier to generate said bias voltage reference at said bias node in response to at least one of a band-gap voltage, a proportional to absolute temperature (PTAT) voltage, or a diode voltage presented to an input of said operational amplifier, and said operational amplifier comprises a high gain and high bandwidth amplifier with a high input impedance differential input stage and a low output impedance output stage.

2. The apparatus according to claim 1, wherein said bias circuit maintains said baseband impedance of said bias node of said amplifier circuit substantially constant over a predefined operating frequency range.

3. The apparatus according to claim 1, wherein said bias circuit maintains said baseband impedance of said bias node of said amplifier circuit substantially constant up to a predefined modulated signal bandwidth.

4. An apparatus comprising:
   an amplifier circuit; and
   a bias circuit configured to dynamically adjust a bias voltage reference at a bias node connected to one or more input transistors of said amplifier circuit to maintain a low baseband impedance, wherein said bias circuit comprises an operational amplifier configured to drive said bias node in response to a first reference signal presented at a first input and a transistor having a collector terminal connected to said first input of said operational amplifier, an emitter terminal connected to a ground potential, and a base terminal coupled to an output of said operational amplifier and said bias node by a resistor.

5. The apparatus according to claim 4, wherein said operational amplifier is further configured to drive said bias node in response to said first reference signal presented at said first input and a second reference signal presented at a second input.

6. The apparatus according to claim 5, wherein:
said first reference signal comprises a reference current; and
said second reference signal comprises a voltage chosen such that the transistor is biased in an active region of operation across predetermined operating conditions.

7. The apparatus according to claim 4, wherein said operational amplifier comprises a high gain and high bandwidth amplifier with a high input impedance differential input stage and a low output impedance output stage.

8. The apparatus according to claim 4, wherein said operational amplifier is implemented using at least one of bipolar technology and complementary metal oxide semiconductor (CMOS) technology.

9. The apparatus according to claim 4, wherein said operational amplifier comprises an input differential pair implemented using complementary metal oxide semiconductor (CMOS) technology and an output stage implemented with one or more bipolar devices.

10. A method of improving linearity of wideband modulated signals comprising:
generating a bias voltage reference using a bias voltage generating circuit comprising an operational amplifier configured to maintain a low baseband impedance at a bias node connected to one or more input transistors of an amplifier circuit, wherein said operational amplifier comprises a high gain and high bandwidth amplifier with a high input impedance differential input stage and a low output impedance output stage, and said operational amplifier is configured as a unity-gain operational amplifier to generate said bias voltage reference at said bias node in response to at least one of a band-gap voltage, a proportional to absolute temperature (PTAT) voltage, or a diode voltage presented to an input of said operational amplifier; and
dynamically adjusting, using said bias voltage generating circuit, a level of said bias voltage reference presented at said bias node.

11. The method according to claim 10, wherein said bias voltage generating circuit maintains said baseband impedance of said bias node of said amplifier circuit substantially constant over a predefined operating frequency range.

12. The method according to claim 10, wherein said bias voltage generating circuit maintains a baseband impedance of said amplifier circuit substantially constant up to a predefined modulated signal bandwidth.

13. The method according to claim 10, further comprising implementing said operational amplifier using at least one of bipolar technology and complementary metal oxide semiconductor (CMOS) technology.

14. The method according to claim 10, further comprising implementing an input differential pair of said operational amplifier using complementary metal oxide semiconductor (CMOS) technology and implementing an output stage of said operational amplifier with one or more bipolar devices.

15. The method according to claim 10, further comprising driving an antenna element of a phased array antenna panel using an output of said amplifier circuit biased by said bias voltage reference.

16. The apparatus according to claim 1, wherein said operational amplifier is implemented using at least one of bipolar technology and complementary metal oxide semiconductor (CMOS) technology.

17. The apparatus according to claim 1, wherein said operational amplifier comprises an input differential pair implemented using complementary metal oxide semiconductor (CMOS) technology and an output stage implemented with one or more bipolar devices.

18. The apparatus according to claim 1, wherein said amplifier circuit is part of a transceiver circuit.

19. The apparatus according to claim 1, wherein said amplifier circuit comprises a differential amplifier circuit.

20. The apparatus according to claim 1, wherein said amplifier circuit is configured to drive an antenna element of a phased array antenna panel.

* * * * *